(12) United States Patent
Matsui et al.

(10) Patent No.: US 8,792,287 B2
(45) Date of Patent: Jul. 29, 2014

(54) NONVOLATILE SEMICONDUCTOR MEMORY DEVICE AND DATA WRITING METHOD

(75) Inventors: Katsuaki Matsui, Kanagawa (JP); Junya Ogawa, Kanagawa (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 185 days.

(21) Appl. No.: 13/413,335

(22) Filed: Mar. 6, 2012

(65) Prior Publication Data

US 2012/0230133 A1 Sep. 13, 2012

(30) Foreign Application Priority Data

Mar. 9, 2011 (JP) ................................. 2011-051392

(51) Int. Cl.
*G11C 7/22* (2006.01)

(52) U.S. Cl.
USPC ............ 365/189.16; 365/185.29; 365/189.19; 365/204

(58) Field of Classification Search
USPC ................... 365/189.16, 189.29, 185.29, 204
See application file for complete search history.

(56) References Cited

U.S. PATENT DOCUMENTS

| 6,847,548 | B2 * | 1/2005 | Swift et al. .................... 365/174 |
| 7,408,820 | B2 * | 8/2008 | Maruyama et al. ....... 365/189.16 |
| 7,630,269 | B2 * | 12/2009 | Oonuki et al. ................ 365/226 |
| 8,085,597 | B2 * | 12/2011 | Yuda ........................ 365/185.21 |
| 8,233,326 | B2 * | 7/2012 | Yuda ........................ 365/185.18 |

FOREIGN PATENT DOCUMENTS

| JP | 10-275842 | 10/1998 |
| WO | WO2006/076145 | 7/2006 |

OTHER PUBLICATIONS

Boaz Eitan, et al., "4-bit per Cell NROM Reliability", IEEE International Electron Devices Melting 2005, iedm Technical Digest, Washington, D.C., Dec. 5-7, 2005, IEEE 2005 Session 22.1.

* cited by examiner

*Primary Examiner* — Pho M Luu
(74) *Attorney, Agent, or Firm* — Volentine & Whitt, PLLC

(57) ABSTRACT

A nonvolatile semiconductor memory quickly and precisely accumulates a desired amount of charges corresponding to data-to-be-written in a charge accumulating part of a memory cell. When charges are injected into the charge accumulating part of the memory cell by applying a writing voltage corresponding to the data-to-be-written to the drain or source region of the memory cell, the writing voltage is reduced on the basis of an increase in the amount of charges accumulated in the charge accumulating part.

20 Claims, 6 Drawing Sheets

FIG. 4

| Verify | VerifyN | DT2 | DT1 | DT0 | S2 | S1 | S0 | NS2 | NS1 | NS0 |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 1 | 0 | 0 | 1 | 0 | 0 | 0 |
| 0 | 0 | 0 | 1 | 0 | 0 | 1 | 0 | 0 | 0 | 0 |
| 0 | 0 | 1 | 0 | 0 | 1 | 0 | 0 | 0 | 0 | 0 |
| 0 | 1 | 0 | 0 | 1 | 0 | 0 | 0 | 0 | 0 | 0 |
| 0 | 1 | 0 | 1 | 0 | 0 | 0 | 0 | 0 | 0 | 1 |
| 0 | 1 | 1 | 0 | 0 | 0 | 0 | 0 | 0 | 1 | 0 |
| 1 | 1 | 0 | 0 | 0 | 0 | 0 | 0 | 1 | 0 | 0 |
| 1 | 1 | 0 | 0 | 1 | 0 | 0 | 0 | 0 | 0 | 0 |
| 1 | 1 | 0 | 1 | 0 | 0 | 0 | 0 | 0 | 0 | 0 |
| 1 | 1 | 1 | 0 | 0 | 0 | 0 | 0 | 0 | 0 | 0 |

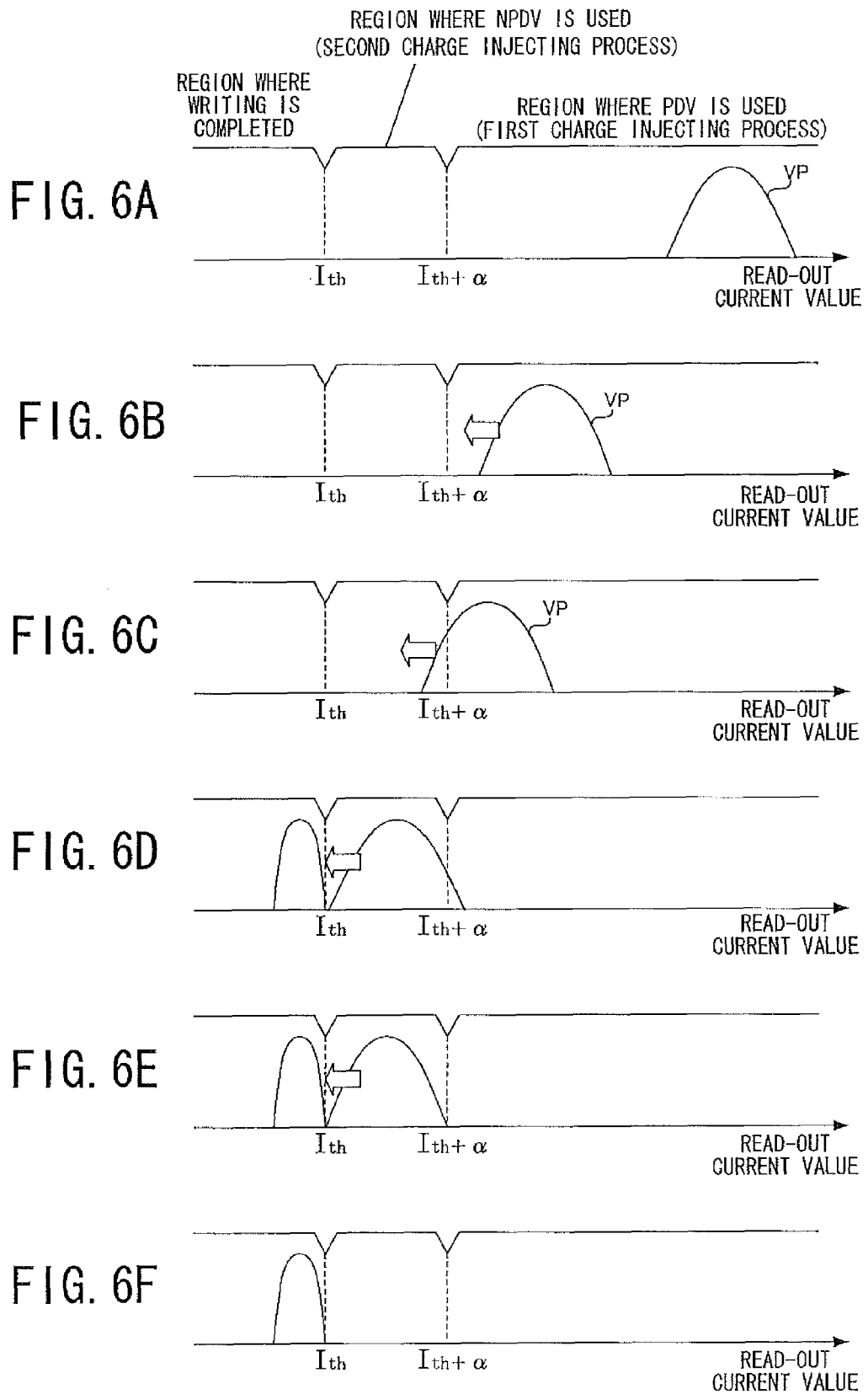

NONVOLATILE SEMICONDUCTOR MEMORY DEVICE AND DATA WRITING METHOD

BACKGROUND OF THE INVENTION

The present invention relates to a nonvolatile semiconductor memory, and also relates to a method of writing data to the nonvolatile semiconductor memory.

Various types of nonvolatile semiconductor memory are known in the art. One type of nonvolatile semiconductor memory includes a plurality of memory cells each composed of a single MOS (metal oxide semiconductor). The memory cell has a drain region and a source region, and these regions have respective charge accumulating parts for accumulating electric charges, thereby enabling storage of bit data of binary values (0, 1), i.e., storage of two-bit data. Such nonvolatile semiconductor memory is disclosed in "Four-bit per Cell NROM Reliability," by Eitan, Boaz and other eleven authors, IEEE International Electron Devices Meeting 2005, iedm Technical Digest, Washington, D.C., Dec. 5-7, 2005 in the United States, IEEE 2005 Session 22.1. Also, such nonvolatile semiconductor memory is disclosed in PCT/US2005/046653 or WO 2006/076145.

In the above-described nonvolatile semiconductor memory, a state where charges (electrons) are not accumulated in the charge accumulating parts is defined as an initial state. The state where no charges are accumulated corresponds to data "1," and a state where charges are accumulated corresponds to data "0."

Data can be written into and read out of the nonvolatile semiconductor memory, and data in the nonvolatile semiconductor memory is erased in the following manner.

Data "0" is written into the charge accumulating part of the drain by applying a positive voltage to the drain region, applying a positive voltage to a gate electrode, and applying a ground voltage to the source region. Upon application of these voltages, hot electrons are injected into the charge accumulating part of the drain to write data "0." Data is read from the drain by applying a positive voltage to the source region, applying a positive voltage to the gate electrode, and applying a ground voltage to the drain region. If no charges are accumulated in the charge accumulating part of the drain, a current higher than a threshold is read out. In this case, it is determined that data "1" is read out. If charges are accumulated in the charge accumulating part of the drain, the value of a current to be read out is lower than the threshold. In this case, it is determined that data "0" is read out. Accordingly, determination of whether binary data is "0" or "1" is made by determining whether or not a read-out current value is less than a predetermined threshold.

SUMMARY OF THE INVENTION

The above-described nonvolatile semiconductor memory makes a determination as to whether binary data is "0" or "1" based on the level of a read-out current value. It is desirable that all memory cells provided in the nonvolatile semiconductor memory have the same read-out current value (first value) corresponding to data "0" and have another same read-out current value (second value) corresponding to data "1." In reality, however, the memory cells do not have the same read-out current values due to nonuniformity made during manufacture, for example.

As a result of such variations, a threshold used to determine if binary data is "0" or "1" is set in a region (hereinafter referred to as "current window") between a range in which read-out current values corresponding to data "1" exist, and a range in which read-out current values corresponding to data "0" exist. It is preferable that the current window will have the greatest possible width in order to determine precisely if data is "0" or "1."

In the above-described nonvolatile semiconductor memory, any of four data "00," "01," "10" and "11" is written into and read out from each of two charge accumulating parts provided in each memory cell. Writing and reading of the four data "00," "01," "10" and "11" make the width of the current window smaller than that in the case of writing and reading of two data "0" and "1." This makes it difficult to precisely determine if a current value read out from a memory cell corresponds to data "00," "01," "10" or "11."

In view of the above-mentioned problems, two-stage writing is often performed in the nonvolatile semiconductor memory in order to expand the width of the current window. In the first stage of writing, a drain stepping process is performed to inject charges quickly by applying a drain voltage that increases stepwise to the drain electrode of a memory cell. In the first stage, the drain stepping process is stopped if a read-out current value reaches a level near a predetermined threshold. In the next stage of writing or the second stage of writing, a gate stepping process is performed to inject charges in tiny amounts by applying a gate voltage that increases stepwise to the gate electrode of the memory cell. In the second stage, it is determined that writing to the memory cell is finished if a read-out current value becomes lower than the predetermined threshold. As such, the drain stepping process in the first stage injects charges rapidly, and when the read-out current value approaches the predetermined threshold, then the gate stepping process takes the place of the drain stepping process to inject charges in tiny amounts. Thus, the amount of accumulated charges precisely becomes a desired amount. There is known another method of carrying out two-stage writing into a memory cell. A high voltage is applied to the memory cell in a first stage of writing, and a lower voltage is applied to the memory cell in a second stage of writing. This approach is disclosed in Japanese Patent Application Publication (Kokai) No. 10-275842.

The above-described two-stage writing makes it possible to accumulate a desired amount of charges in each memory cell more precisely than a writing method of trying to accumulate charges by applying a voltage once. With the two-stage writing, therefore, read-out current values corresponding to values of data-to-be-written are confined in a narrower width, and it becomes possible to expand the width of the current window.

The gate stepping process can make the amount of accumulated charges precisely become a desired amount. However, charges only in tiny amounts can be injected in one writing process. Accordingly, writing should be performed many times, and longer time is required for data writing.

It is an object of the present invention to provide a nonvolatile semiconductor memory that includes a plurality of memory cells each provided with a charge accumulating part and that can quickly and precisely accumulate a predetermined amount of charges corresponding to data-to-be-written in the charge accumulating part of the memory cell concerned.

Another object of the present invention is to provide a data writing method, used for a nonvolatile semiconductor memory having a plurality of memory cells, that enable quick and precise accumulation of a desired amount of charges corresponding to data-to-be-written in a charge accumulating part of the memory cell concerned.

According to one aspect of the present invention, there is provided a nonvolatile semiconductor memory that includes a plurality of memory cells each having an MOSFET (Metal-Oxide-Semiconductor Field-Effect Transistor) structure with a charge accumulating part. The nonvolatile semiconductor memory also includes a writing voltage applying part for injecting charges into the charge accumulating part by applying a writing voltage corresponding to data-to-be-written to a drain or source region of any one of the memory cells. The nonvolatile semiconductor memory also includes a controller for reducing the writing voltage on the basis of increase of the amount of charges accumulated in the charge accumulating part.

According to a second aspect of the present invention, there is provided a data writing method of writing data into a nonvolatile semiconductor memory. The nonvolatile semiconductor memory has a plurality of memory cells each having a MOSFET structure with a charge accumulating part. The data writing method includes a first step of injecting charges into the charge accumulating part until the amount of the accumulated charges exceeds a second charge value smaller than a first charge value corresponding to the value of data-to-be-written by applying a first writing voltage corresponding to the value of the data-to-be-written to the drain or source region of the memory cell. The data writing method also includes a second step of injecting charges into the charge accumulating part to make the amount of the accumulated charges become the first charge value by applying a second writing voltage lower than the first writing voltage to the drain or source region of the memory cell. The second step is carried out after the first step.

When charges are injected into the charge accumulating part of the memory cell by applying a writing voltage corresponding to data-to-be-written to the drain or source region of the memory cell, the writing voltage is reduced on the basis of the increased amount of charges accumulated in the charge accumulating part. It is therefore possible to precisely cause the amount of charges accumulated in the charge accumulating part to reach (or become) a charge amount corresponding to the value of the data-to-be-written (i.e., a desired amount of charges).

Thus, the present invention can reduce the frequency of writing (how many times writing is carried out), compared to the conventional data writing method that includes the gate stepping process involving writing with relatively high frequency for making the amount of accumulated charges become a predetermined amount, namely a process of injecting charges by applying a writing voltage corresponding to data-to-be-written to the gate region of a memory cell.

Further, the present invention makes it possible to simultaneously write data-to-be-written representing different values to a plurality of memory cells. As such, time to be spent for writing can be reduced, compared to the case where charges of an amount corresponding to data-to-be-written are injected in a time-sharing manner for respective values of the data-to-be-written.

According to still another aspect of the present invention, there is provided a nonvolatile semiconductor memory that includes a plurality of memory cells. Each memory cell has an MOSFET structure with a first charge accumulating part associated with its drain region and a second charge accumulating part associated with its source region. The semiconductor memory also includes a selection part for selecting one of the memory cells, and for selecting either the drain region or the source region of the selected memory cell for data writing. The semiconductor memory also includes a writing voltage applying part for applying a writing voltage corresponding to data-to-be-written to the selected region of the selected memory cell thereby injecting charges into the charge accumulating part associated with the selected region of the selected memory cell. The semiconductor memory also includes a controller for reducing the writing voltage based on an increase in an amount of the charges accumulated in the charge accumulating part concerned.

The controller may include a writing voltage generating part for generating a first voltage or a second voltage. The second voltage is lower than the first voltage, and the first or second voltage is used as the writing voltage. The controller may also include a first determining part for determining whether the amount of charges accumulated in the charge accumulating part exceeds a second charge amount smaller than a first charge amount corresponding the value of the data-to-be-written. This determination may be made based on a value of a current from the selected memory cell. The controller may also include a voltage changing part for setting the writing voltage at the first voltage until the first determining part determines that the amount of charges accumulated in the charge accumulating part exceeds the second charge amount, and for changing the writing voltage from the first voltage to the second voltage when the first determining part determines that the amount of charges accumulated in the charge accumulating part exceeds the second charge amount. The nonvolatile semiconductor memory may also include a second determining part for determining whether the amount of charges accumulated in the charge accumulating part reaches the first charge amount based on a value of a current from the selected memory cell upon application of the writing voltage having the second voltage to the selected region of the selected memory cell. The voltage changing part may bring the selected region of the selected memory cell into a high-impedance state if the second determining part determines that the amount of charges accumulated in the charge accumulating part reaches the first charge amount.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 4 is a truth table useful to explain the operation of a state determining circuit provided in the nonvolatile semiconductor memory shown in FIG. 1;

FIGS. 6A to 6F are a series of views showing transition of a read-out current value observed during data writing operation of the nonvolatile semiconductor memory shown in FIG. 1.

DETAILED DESCRIPTION OF THE INVENTION

When a nonvolatile semiconductor memory according to an exemplary embodiment of the invention injects charges in a charge accumulating part in a memory cell by applying a writing voltage corresponding to data-to-be-written to the drain or source region of the memory cell, the writing voltage is reduced on the basis of an increase of the amount of charges accumulated in the charge accumulating part. Specifically, a first voltage is applied as the writing voltage corresponding to the value of the data-to-be-written to the drain or source region of the memory cell to inject charges into the charge accumulating part until the amount of the accumulated charges exceeds a second charge amount smaller than a first charge amount corresponding to the value of the data-to-be-written. If the amount of the accumulated charges exceeds the second charge amount, charges are injected into the charge accumulating part by applying the writing voltage having a second voltage lower than the first voltage to the drain or source region of the memory cell to make the amount of the accumulated charges become the first charge amount.

Figure 1:
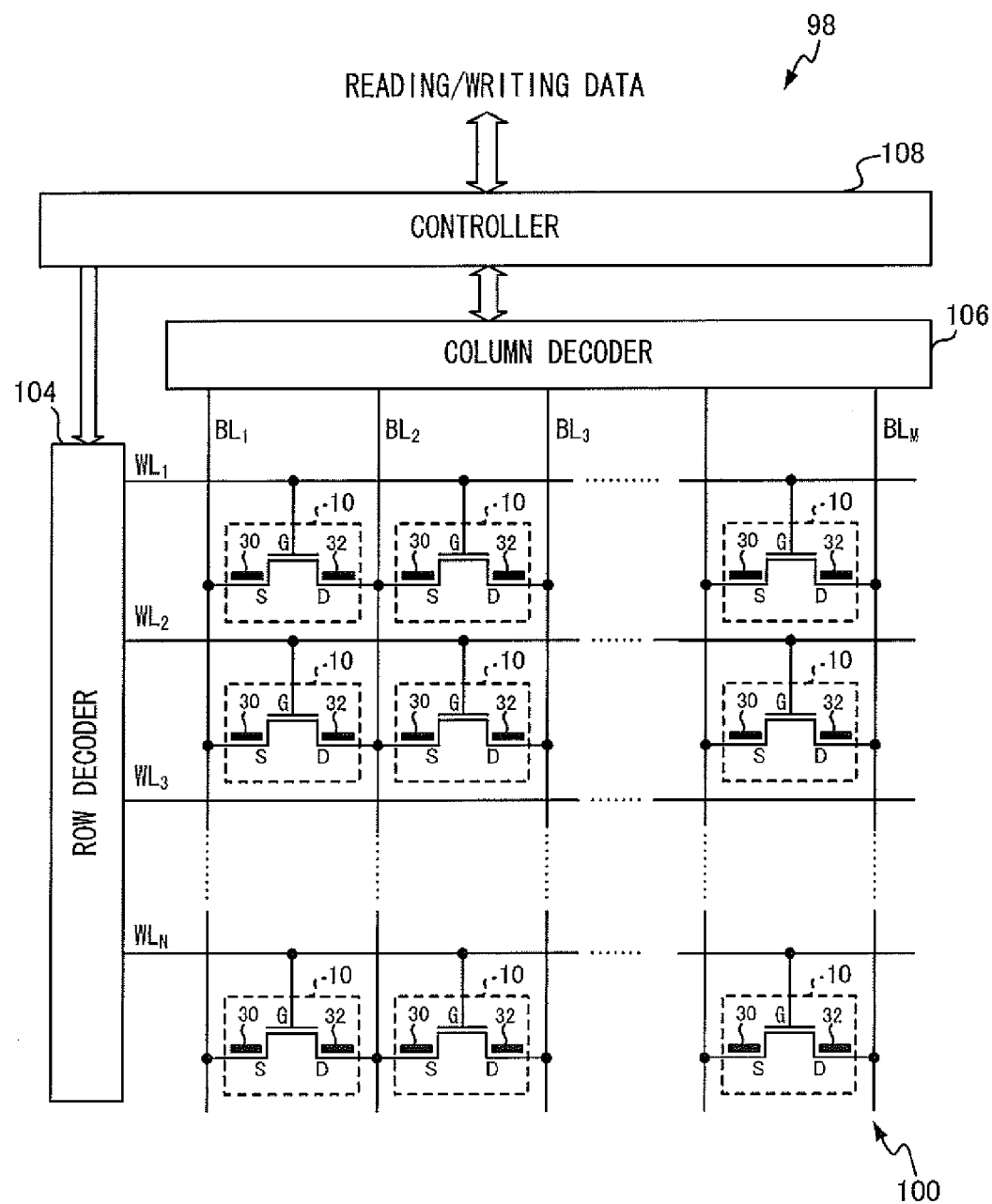
FIG. 1 is a block diagram showing the internal structure of a nonvolatile semiconductor memory according to an embodiment of the present invention.

Referring to FIG. 1, a structure of the nonvolatile semiconductor memory 98 according to one embodiment of the present invention will be described.

As shown in FIG. 1, the nonvolatile semiconductor memory 98 includes a memory cell array 100, a row decoder 104, a column decoder 106, and a controller 108.

The memory cell array 100 includes a plurality of bit lines $BL_1$ to $BL_M$ (M is an integer greater than one) arranged in the column direction, and a plurality of word lines $WL_1$ to $WL_N$ (N is an integer greater than one) crossing the bit lines $BL_1$ to $BL_M$ and arranged in the row direction. Memory cells 10 are provided at intersections of the bit lines BL and the word lines WL. The memory cells 10 have the same configuration. Each of the memory cells 10 has an n-channel MOSFET (metal-oxide-semiconductor field-effect transistor), for example.

Figure 2:
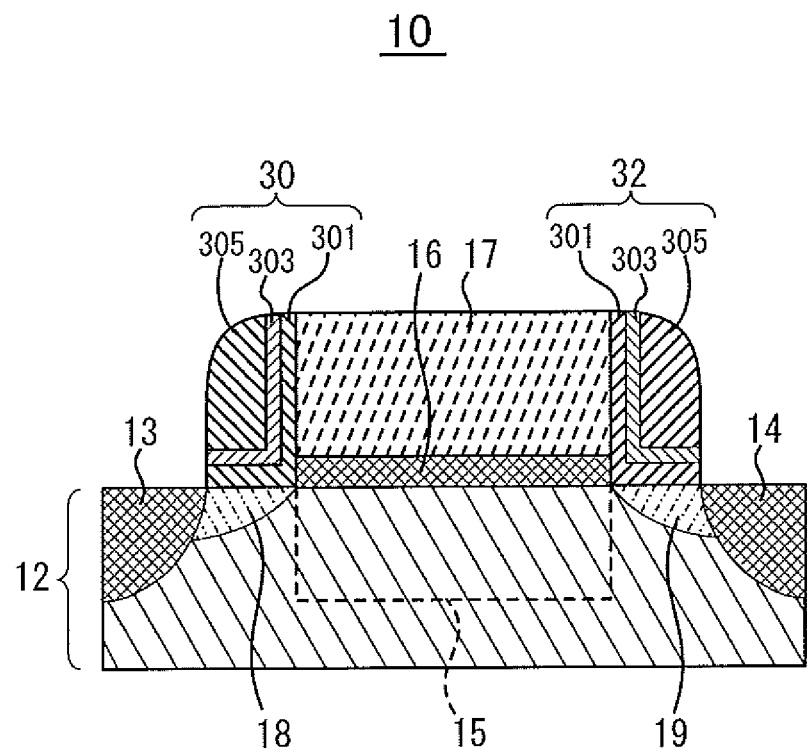
FIG. 2 is a cross-sectional view showing the structure of a memory cell in the nonvolatile semiconductor memory shown in FIG. 1.

FIG. 2 is a cross-sectional view of the principal part of the memory cell 10.

As shown in FIG. 2, a gate electrode 17 (hereinafter also referred to as "gate terminal") made of polysilicon is provided over the upper surface of a p-type silicon substrate 12 with a gate oxide film 16 made of $SiO_2$ being provided between the silicon substrate 12 and the gate electrode 17. The gate electrode 17 is connected to the word line WL as shown in FIG. 1. A source region 13 and a drain region 14 containing highly-concentrated n-type impurities are provided at positions in a surface of the silicon substrate 12 between which the gate electrode 17 is provided. The source region 13 (hereinafter also referred to as "source terminal") and the drain region 14 (hereinafter also referred to as "drain terminal") are connected to different bit lines BL as shown in FIG. 1. A channel region 15, in which a current path is formed while the MOSFET is being in operation, is defined on the surface of the silicon substrate 12 directly below the gate electrode 17. N-type extension regions 18 and 19 containing impurities of a relatively low concentration are formed between the channel region 15 and the source region 13, and between the channel region 15 and the drain region 14, respectively. The extension regions 18 and 19 are adjacent to the source region 13 and the drain region 14, respectively. The extension regions 18 and 19 are provided to inject charges efficiently into charge accumulating parts (will be described later). A charge accumulating part 30 is provided on the extension region 18 on the source side, and another charge accumulating part 32 is provided on the extension region 19 on the drain side. Each of the charge accumulating parts 30 and 32 has an ONO stacked insulating film having a silicon oxide film 301, a silicon nitride film 303, and a silicon oxide film 305. The charge accumulating parts 30 and 32 extend from the extension regions 18 and 19 respectively to cover side walls of the gate electrode 17, so that charges can be reliably accumulated and stored. The charge accumulating parts 30 and 32 are not physically connected, but are spaced apart from each other. Thus the charge accumulating parts 30 and 32 can independently hold charges accumulated therein.

On the basis of a voltage applied to the gate terminal of each memory cell 10 through the word line WL, and voltages applied to the drain and source terminals through a pair of bit lines BL, data is written into and read out from the memory cell 10 through these bit lines BL.

When data to be written into the memory cell array 100 is received from outside, the controller 108 executes a data writing program (will be described later). Then, the controller 108 supplies a control signal to the row decoder 104 that includes address information indicating a destination of the received data (destination of writing), and information designating a voltage to be applied to the word line WL. The controller 108 also supplies a control signal to the column decoder 106 that includes the same address information, and a voltage designating signal VT (will be described later) designating a voltage to be applied to a bit line BL corresponding to the received data. If the controller 108 determines that a test conducted in a first verification process has been passed, i.e., if the controller 108 determines that the amount of accumulated charges is well comparable to (or sufficient for) the value of the data-to-be-written (hereinafter referred to as "writing data"), the controller 108 supplies a first verification result signal Verify at a logic level 1 to the column decoder 106. If the controller 108 determines that the amount of accumulated charges is insufficient, the controller 108 supplies the first verification result signal Verify at a logic level 0 to the column decoder 106. If the controller 108 determines that a test conducted in a second verification process (will be described later) has been passed, the controller 108 supplies a second verification result signal VerifyN at a logic level 1 to the column decoder 106. Otherwise the controller 108 supplies the second verification result signal VerifyN at a logic level 0 to the column decoder 106. As will be described later, in the first verification process, the amount of accumulated charges is tested by using a threshold current value $I_{th}$ corresponding to the value of writing data as a reference current value $I_{ref}$. In the second verification process, the amount of accumulated charges is tested by using a value obtained by adding an offset α to the threshold current value $I_{th}$ as the reference current value $I_{ref}$.

The row decoder 104 selects one word line WL from the word lines $WL_1$ to $WL_N$ in the memory cell array 100 on the basis of the control signal supplied from the controller 108, and supplies a gate voltage to the selected word line WL. As a result, those memory cells 10 which are connected to the word line WL supplied with the gate voltage each become a target memory cell into which or from which data is to be written or read out.

The column decoder 106 selects at least one pair of bit lines BL on the basis of the control signal supplied from the controller 108, and supplies a writing voltage between the drain and the source terminals of that memory cell 10 which is connected to the selected bit lines BL. The column decoder 106 sets the bit lines BL at a ground potential to cause a current resulting from charges accumulated in the charge accumulating part 32 of the memory cell 10 to flow into the bit lines BL. Then, the column decoder 106 supplies a read-out current value representing the value of the current flowing in the bit lines BL to the controller 108.

Figure 3:
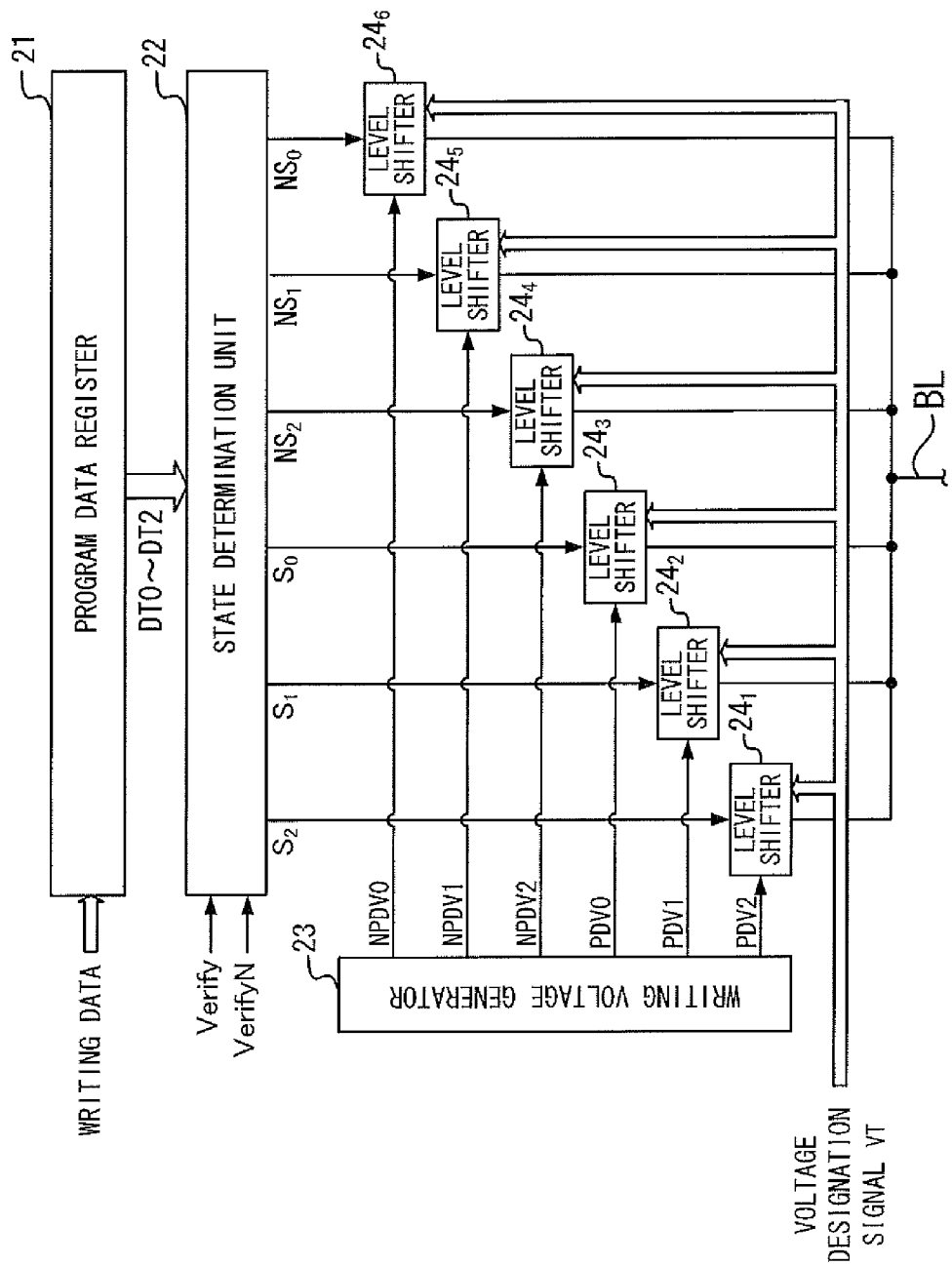
FIG. 3 is a block diagram of a data writing circuit in a column decoder of the nonvolatile semiconductor memory shown in FIG. 1.

Referring now to FIG. 3, a configuration of an exemplary data writing circuit contained in the column decoder 106 will be described. The configuration shown in FIG. 3 corresponds to one block out of M blocks of data writing circuit that are associated with the M bit lines $BL_1$ to $BL_M$ respectively.

As shown in FIG. 3, the data writing circuit includes a program data register 21, a state determining circuit 22, a writing voltage generating circuit 23, and level shifters $24_1$ to $24_6$.

The program data register 21 extracts, from data supplied from outside, two-bit data (hereinafter referred to as "writing data") corresponding to digits in bit form to be written into that memory cell 10 which is connected to a corresponding bit line BL, and generates program data DT0 to DT2 that express in three bits a value represented by the writing data (data-to-be-written).

As an example, if the writing data represents "00," the program data register 21 generates the program data DT0 to DT2 as shown below:
DT0: 1
DT1: 0
DT2: 0.

If the writing data represents "01," the program data register 21 generates the program data DT0 to DT2 as shown below:
DT0: 0
DT1: 1
DT2: 0.

If the writing data represents "10," the program data register 21 generates the program data DT0 to DT2 as shown below:
DT0: 0
DT1: 0
DT2: 1.

If the writing data represents "11," the program data register 21 generates the program data DT0 to DT2 as shown below:
DT0: 0
DT1: 0
DT2: 0.

The program data register 21 stores the generated program data DT0 to DT2, and supplies the program data DT0 to DT2 to the state determination circuit 22.

Using a truth table shown in FIG. 4, the state determination circuit 22 determines the writing states of the charge accumulating parts 30 and 32 on the basis of the values of the program data DT0 to DT2, the first verification result signal Verify and the second verification result signal VerifyN. Then, the state determination circuit 22 supplies determination result signals S0 to S2 and NS0 to NS2 indicating the determination results to the corresponding level shifters $24_1$ to $24_6$ as shown in FIG. 3, respectively.

The writing voltage generating circuit 23 generates a drain voltage PDV0 and another drain voltage NPDV0 lower than the drain voltage PDV0 as drain voltages to be used when "00" is written as writing data. The writing voltage generating circuit 23 generates a drain voltage PDV1 and another drain voltage NPDV1 lower than the drain voltage PDV1 as drain voltages to be used when "01" is written as writing data. The writing voltage generating circuit 23 generates a drain voltage PDV2 and another drain voltage NPDV2 lower than the drain voltage PDV2 as drain voltages to be used when "10" is written as writing data. The writing voltage generating circuit 23 supplies the drain voltages PDV0 to PDV2 and NPDV0 to NPDV2 to the corresponding level shifters $24_1$ to $24_6$ as shown in FIG. 3, respectively.

If the determination result signals S0 to S2 and NS0 to NS2 supplied to the level shifters $24_1$ to $24_6$ are at a logic level 1, the level shifters 24 apply the drain voltages (PDV0 to PDV2 and NPDV0 to NPDV2) as writing voltages to the bit line BL.

If the determination result signals S0 to S2 and NS0 to NS2 supplied to the level shifters $24_1$ to $24_6$ are at a logic level 0, the level shifters 24 bring the bit line BL into a high-impedance state. If only the determination result signal S0 is at a logic level 1 and the other determination result signals S1 and S2 and NS0 to NS2 are all at a logic level 0 as shown in FIG. 4, then only the level shifter $24_3$ among the level shifters $24_1$ to $24_6$ applies the drain voltage PDV0 supplied to the level shifter $24_3$ to the bit line BL. The level shifters $24_1$ to $24_6$ change the respective voltage values of the corresponding drain voltages PDV0 to PDV2 and NPDV0 to NPDV2 on the basis of the voltage designating signal VT supplied from the controller 108.

The operation of the data writing circuit shown in FIG. 3 is described below.

Figure 5:
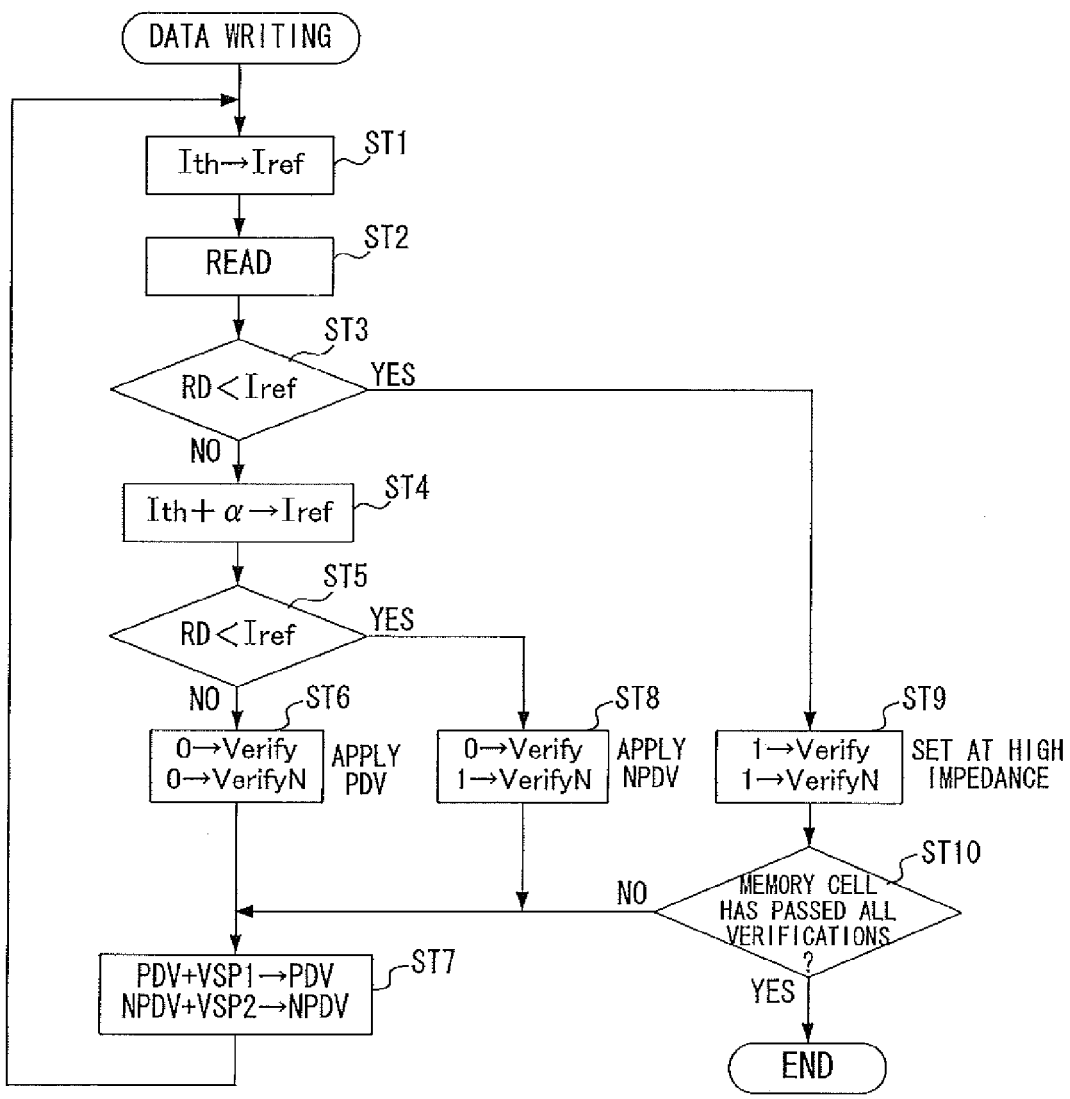
FIG. 5 is a flow diagram showing a data writing program executed by the nonvolatile semiconductor memory shown in FIG. 1.

FIG. 5 illustrates an exemplary data writing program to be executed by the controller 108 in order to cause the above-described data writing circuit to operate.

Each time the program data DT0 to DT2 generated based on writing data are stored in the program data register 21, the data writing program is executed for each memory cell 10 that is connected to that word line WL which is selected as a target for writing.

In FIG. 5, the controller 108 first sets the threshold current value $I_{th}$ corresponding to the value of the writing data ("00," "01," "10" or "11"). This threshold is used as the reference current value $I_{ref}$ (step ST1). For example, first to third threshold current values $I_{th}$ having different values and corresponding to the values of writing data "00," "01" and "10" respectively are allocated (prepared). A threshold value $I_{th}$ corresponding to the value of writing data actually supplied is selected from the first to third threshold current values $I_{th}$, and the selected threshold current value $I_{th}$ is set. The threshold current value $I_{th}$ is the lowest possible current value to be read from a memory cell 10 when charges of an amount well comparable to the value of the writing data (first charge amount) are accumulated in the charge accumulating part 30 (or 32) of the memory cell 10. The threshold current value $I_{th}$ is a threshold used to determine if the amount of charges accumulated in the charge accumulating part 30 (or 32) has reached the first charge amount corresponding to the value of the writing data.

Next, the controller 108 causes the row decoder 104 to apply a high voltage to one word line WL targeted for writing, and causes the column decoder 106 to set a bit line BL at a ground potential, thereby reading a current resulting from charges accumulated in the charge accumulating part 32 (hereinafter referred to as "read-out current") and providing the read-out current onto the bit line BL (step ST2). The column decoder 106 detects the read-out current on the bit line BL, and supplies a read-out current value RD indicating the value of the read-out current to the controller 108.

Then, the controller 108 performs the first verification to determine if the read-out current value RD is lower than the reference current $I_{ref}$ (step ST3). Specifically, in the first verification, the controller 108 determines on the basis of the read-out current value RD if the amount of charges accumulated in the charge accumulating part 32 has exceeded an amount corresponding to the writing data. Determining that the amount of charges accumulated in the charge accumulating part 32 has exceeded the amount corresponding to the writing data means pass of the first verification.

If it is determined in the step ST3 that the read-out current value RD is higher than the reference current value $I_{ref}$, i.e., if it is determined in the step ST3 that the amount of charges accumulated in the charge accumulating part 32 is insufficient, then the controller 108 changes the threshold current value (or the reference current value), i.e., the controller 108 sets a threshold current value ($I_{th}+\alpha$) which is obtained by adding an offset a to the threshold current value $I_{th}$ and uses it as the reference current value $I_{ref}$ (step ST4). As described above, the threshold current value ($I_{th}+\alpha$) is a threshold used to determine on the basis of a read-out current if the amount of charges accumulated in a charge accumulating part has reached the second charge amount smaller than the first charge amount corresponding the value of the writing data.

Next, the controller 108 performs the second verification to determine if the read-out current value RD is lower than the reference current $I_{ref}$ having the threshold current value ($I_{th}+\alpha$) (step ST5). Specifically, in the second verification, the controller 108 determines on the basis of the read-out current value RD if the amount of charges accumulated in the charge accumulating part 32 has exceeded the second charge amount smaller by the offset a than the first charge amount corresponding to the writing data. Determining that the amount of charges accumulated in the charge accumulating part 32 has exceeded the second charge amount smaller by the offset a than the first charge amount corresponding to the writing data means pass of the second verification.

If it is determined in the step ST5 that the read-out current value RD is greater than the reference current value $I_{ref}$, i.e., if it is determined in the second verification that the amount of accumulated charges is insufficient, the controller 108 supplies the first and second verification result signals Verify and VerifyN both at a logic level 0 to the state determining circuit 22 indicating that both the first verification and the second verification have not been passed (step ST6). After the step ST6, the state determining circuit 22 refers to the truth table shown in FIG. 4 to obtain the first verification result signal Verify at a logic level 0, the second verification result signal VerifyN at a logic level 0, and the determination result signals S0 to S2 and NS0 to NS2 responsive to the program data DT0 to DT2. If the program data DT0 to DT2 are at the following logic levels corresponding to the writing data "00," the level shifter 24$_3$ applies the drain voltage PDV0 as a writing voltage to the bit line BL in response to the determination result signal S0 at a logic level 1:
DT0: 1
DT1: 0
DT2: 0.

If the program data DT0 to DT2 are at the following logic levels corresponding to the writing data "01," then the level shifter 24$_2$ applies the drain voltage PDV1 as a writing voltage to the bit line BL in response to the determination result signal S1 at a logic level 1:
DT0: 0
DT1: 1
DT2: 0.

If the program data DT0 to DT2 are at the following logic levels corresponding to the writing data "10," then the level shifter 24$_1$ applies the drain voltage PDV2 as a writing voltage to the bit line BL in response to the determination result signal S2 at a logic level 1:
DT0: 0
DT1: 0
DT2: 1.

As a result of the above-described application of the writing voltage (PDV0, PDV1 or PDV2), charges corresponding to the value of the writing voltage is injected into the charge accumulating part 32 of that memory cell 10 which is located at an intersection of the selected word line WL and bit line BL.

Subsequent to the step ST6, the controller 108 proceeds to the step ST7. Specifically, the controller 108 supplies the voltage designating signal VT to the level shifters 24$_1$ to 24$_6$ for increasing each of the currently generated values of the drain voltages PDV0 to PDV2 by a predetermined step voltage VSP1, and for increasing each of the currently generated values of the drain voltages NPDV0 to NPDV2 by another predetermined step voltage VSP2 (step ST7).

After executing the step ST7, the controller 108 returns to the step ST1 to repeat the above-described operation.

More specifically, the controller 108 repeats the processes in the steps ST1 to ST7 until the controller 108 determines in the step ST5 that the read-out current value RD is lower than the reference current value $I_{ref}$, i.e., that the amount of charges accumulated in the charge accumulating part 32 has exceeded the second charge amount, which is smaller by the offset $\alpha$ than the first charge amount corresponding to the writing data. In summary, until the second verification is passed, the controller 108 determines on the basis of the value of a current read out from the memory cell 10 if the amount of charges accumulated in the charge accumulating part 32 has exceeded the second charge amount while stepwise increasing the drain voltage PDV to be applied to the bit line BL.

If it is determined in the step ST5 that the read-out current value RD is lower than the reference current value $I_{ref}$ ($I_{th}+\alpha$), i.e., if the second verification is passed, the controller 108 supplies the second verification result signal VerifyN at a logic level 1 indicating that the second verification has been passed, and the first verification result signal Verify at a logic level 0 indicating that the first verification has not been passed, to the state determining circuit 22 (step ST8). Upon execution of the step ST8, the state determining circuit 22 refers to the truth table shown in FIG. 4 to obtain the first verification result signal Verify at a logic level 0, the second verification result signal VerifyN at a logic level 1, and the determination result signals S0 to S2 and NS0 to NS2 responsive to the program data DT0 to DT2. If the program data DT0 to DT2 are at the following logic levels corresponding to the writing data "00," the level shifter 24$_6$ applies the drain voltage NPDV0 as a writing voltage to the bit line BL in response to the determination result signal NS0 at a logic level 1:
DT0: 1
DT1: 0
DT2: 0.

If the program data DT0 to DT2 are at the following logic levels corresponding to the writing data "01," then the level shifter 24$_5$ applies the drain voltage NPDV1 as a writing voltage to the bit line BL in response to the determination result signal NS1 at a logic level 1:
DT0: 0
DT1: 1
DT2: 0.

If the program data DT0 to DT2 are at the following logic levels corresponding to the writing data "10," then the level shifter 24$_4$ applies the drain voltage NPDV2 as a writing voltage to the bit line BL in response to the determination result signal NS2 at a logic level 1:
DT0: 0
DT1: 0
DT2: 1.

As a result of the above-described application of the writing voltage (NPDV0, NPDV1 or NPDV2), charges corresponding to the value of the writing voltage is injected into the charge accumulating part 32 of that memory cell 10 which is located at an intersection of the selected word line WL and bit line BL.

After executing the step ST8, the controller 108 returns to the step ST7 to repeat the processes in the steps ST1 to ST5, ST8 and ST7.

Specifically, if the second verification is passed, the controller 108 changes a drain voltage to be applied to the bit line BL to NPDV, which is lower than PDV (ST8), and stepwise increases the value of the voltage to be applied (ST7). Based on the read-out current value RD from the memory cell 10, the controller 108 determines if the amount of charges accumulated in the charge accumulating part 32 has reached the first charge amount corresponding to the value of the writing data, i.e., the controller 108 performs the first verification (ST3).

If it is determined in the step ST3 that the read-out current value RD is lower than the reference current value $I_{ref}$ (threshold current value $I_{th}$) i.e., that the amount of charges accumulated in the charge accumulating part 32 is well comparable to the writing data, the controller 108 supplies the first verification result signal Verify at a logic level 1 indicating that the first verification has been passed to the state determining circuit 22 (step ST9). Execution of the step ST9 makes both the first and second verification result signals Verify and VerifyN at a logic level 1. Accordingly, the state determining circuit 22 refers to the truth table shown in FIG. 4 to obtain the determination result signals S0 to S2 and NS0 to NS2 each at a logic level 0. This stops application of a drain voltage to the bit line BL, thereby bringing the bit line BL into a high-impedance condition.

After executing the step ST9, the controller 108 determines if the first and second verification result signals Verify and VerifyN are both at a logic level 1 in each of those memory cells 10 which are targeted for writing among those memory cells 10 which are connected to the selected word line WL (step ST10). That is, the controller 108 determines if the amount of charges accumulated in the charge accumulating part 32 in each of the memory cells 10 targeted for writing is well comparable to the writing data. The controller 108 repeats the operations in the steps ST1 to ST10 for each of the memory cells 10 targeted for writing until the controller 108 determines in the step ST10 that the first and second verification result signals Verify and VerifyN are both at a logic level 1 in each of the memory cells 10 targeted for writing.

The data writing operation carried out by executing the data writing program shown in FIG. 5 is described below by referring to the diagrams shown in FIG. 6A to FIG. 6F. FIG. 6A to FIG. 6F show transition of a read-out current value.

In an initial state, there are no charges accumulated in the charge accumulating part 32 (or 30) of each of memory cells 10 targeted for writing. Accordingly, a distribution VP of read-out current values that can be the values of currents read from the memory cells 10 has a center value considerably higher than the threshold value $I_{th}$, as shown in FIG. 6A. Thus, both the first verification (ST3) and the second verification (ST5) are not passed in the initial state.

If the drain voltage PDV to be applied to a bit line BL is increased by the step voltage VSP1 in a stepwise manner by repeatedly performing the series of processes from the steps ST1 to ST7 (FIG. 5), an increasing amount of charges is accumulated in a charge accumulating part of a memory cell 10. In response to the increased accumulation of charges, the distribution VP of the values of currents read from the memory cells 10 becomes closer to the threshold current value $I_{th}$ as indicated by the unshaded arrow in FIG. 6B.

If it is determined in the second verification (ST5) that a read-out current value becomes lower than the second threshold current value $I_{th}+\alpha$ as shown in FIG. 6C, a drain voltage to be applied to the bit line BL is changed from the current value PDV to the drain voltage NPDV lower than the current value PDV (ST8). Specifically, if a read-out current value is lower than the second threshold current value $I_{th}+\alpha$ but it is still higher than the first threshold current value $I_{th}$, then charge injecting operation (ST8, ST7 and ST1 to ST5) is performed in which a drain voltage is reduced once from PDV to NPDV, and then the drain voltage is increased stepwise from NPDV, so that the read-out current value precisely reaches the threshold current value $I_{th}$. This series of processes makes the values of currents read from some of the memory cells 10 targeted for writing become lower than the threshold current value $I_{th}$ as shown in FIG. 6D. That is, in each of these memory cells 10, charges of an amount (first charge amount) well comparable to the value of writing data are accumulated. In this case, it is determined in the first verification (ST3) that a read-out current value becomes lower than the threshold current value $I_{th}$. Accordingly, a bit line BL to which these memory cells 10 are connected is brought into a high-impedance condition (ST9).

Next, the series of processes from the steps ST8, ST7, ST1 to ST5 is repeated. As a result, the values of currents read from the memory cells 10 targeted for writing become all lower than the second threshold current value $I_{th}+\alpha$ as shown in FIG. 6E, and eventually, become lower than the first threshold current value $I_{th}$ as shown in FIG. 6F. This means that charges of an amount (first charge amount) well comparable to the value of writing data are accumulated in each of the memory cells targeted for writing.

As described above, in the data writing realized by the program (flowchart) shown in FIG. 5, charges in large amounts are injected first at a time by applying a first drain voltage PDV as a writing voltage (first charge injecting step). Thus, charges are injected quickly into a charge accumulating part such that the amount of accumulated charges becomes the second charge amount which is smaller than the first charge amount corresponding to the value of the writing data. When the amount of charges accumulated in the charge accumulating part exceeds the second charge amount, then charges in smaller amounts are injected at several times by applying a second drain voltage NPDV lower than PDV (second charge injecting step) at each injection. Thus, the amount of accumulated charges can gradually and precisely reach the first charge amount. Execution of the second charge injecting step suppresses variations among the amounts of charges accumulated in memory cells and narrows the width of distribution of the values of currents read from the memory cells. This in turn expands the width of the current window.

In this manner of data writing, the amount of accumulated charges can reach a predetermined amount quickly and precisely by performing only the drain stepping process. This makes it possible to reduce the frequency of writing (how many times the writing is carried out), compared to the conventional data writing method that employs not only the drain stepping process but also the gate stepping process which involves writing with relatively high frequency to make the amount of accumulated charges become a predetermined amount. As a result, processing time for writing can be shortened in the illustrated embodiment.

In the nonvolatile semiconductor memory 98 shown in FIG. 1, the bit lines $BL_1$ to $BL_M$ are individually subjected to the data writing process shown in FIG. 5. This makes it possible to simultaneously write data representing different values to a plurality of memory cells 10 that are connected to the same word line WL, respectively. For example, while data "00" is written into a memory cell 10 that is connected to the bit line $BL_1$, data "01" can be written into another memory cell 10 that is connected to the bit line $BL_3$, and further, data "10" can be written into yet another memory cell 10 that is connected to the bit line $BL_5$.

The operation described in the embodiment is intended to write data into the charge accumulating part 32 on the drain side that is one of the two charge accumulating parts 30 and 32 provided in each memory cell 10. It should be noted that data is also written into the charge accumulating part 30 on the source side. For this writing, a source voltage PDV is applied as a writing voltage to the source terminal of a memory cell 10 in the first charge injecting step, and another source voltage NPDV lower than the source voltage PDV is applied as a writing voltage to the source terminal of the memory cell 10 in the second charge injecting step.

In summary, the first charge injecting step of injecting a large(r) amount of charges is carried out by applying a first voltage (PDV) as a writing voltage to the drain or source region of a memory cell, and the second charge injecting step of injecting a small(er) amount of charges is carried out by applying a second voltage (NPDV) lower than the first voltage as a writing voltage to the drain or source region of the memory cell. The second charge injecting step may be carried out a plurality of times.

In the data writing process shown in FIG. 5, data are written in two stages including the first charge injecting step of applying the drain voltage PDV, and the second charge injecting step of applying the drain voltage NPDV lower than PDV. It should be noted, however, that data may be written in three or more stages.

In other words, when charges are to be injected into a charge accumulating part of a memory cell by applying a writing voltage corresponding to data-to-be-written to the drain or source region of the memory cell, the writing voltage to be applied to the drain or source region is reduced in response to the increase of the amount of charges accumulated in the charge accumulating part. If the first charge injecting step is divided into processes in n stages where n is an integer greater than one, n different offsets α which will be added to the threshold current value $I_{th}$ are prepared, and n threshold values ($I_{th}+α$) are each subjected to the second verification (ST4 and ST5). In addition, n drain voltages NPDV having n different voltage values are prepared as voltages to be generated by the writing voltage generating circuit 23.

This application is based on Japanese Patent Application No. 2011-51392 filed on Mar. 9, 2011, and the entire disclosure thereof is incorporated herein by reference.

What is claimed is:

1. A nonvolatile semiconductor memory comprising:
a plurality of memory cells, each said memory cell having an MOSFET (Metal-Oxide-Semiconductor Field-Effect Transistor) structure with a first charge accumulating part associated with its drain region and a second charge accumulating part associated with its source region;
a writing voltage applying part for applying a writing voltage corresponding to data-to-be-written to the drain or source region of one of said memory cells thereby injecting charges into the first or second charge accumulating part associated with the drain or source region concerned; and
a controller for reducing the writing voltage based on an increase in an amount of the charges accumulated in the charge accumulating part concerned, and continuing a writing operation with the reduced writing voltage.

2. The nonvolatile semiconductor memory according to claim 1, wherein the controller includes:
a writing voltage generating part for generating a first voltage or a second voltage, the second voltage being lower than the first voltage, the first or second voltage being used as the writing voltage;
a first determining part for determining whether the amount of charges accumulated in the charge accumulating part exceeds a second charge amount smaller than a first charge amount, said first charge amount corresponding the value of the data-to-be-written, the determination being made based on a value of a current from the memory cell; and
a voltage changing part for setting the writing voltage at the first voltage until the first determining part determines that the amount of charges accumulated in the charge accumulating part exceeds the second charge amount, and for changing the writing voltage from the first voltage to the second voltage when the first determining part determines that the amount of charges accumulated in the charge accumulating part exceeds the second charge amount,
wherein the second voltage is the reduced writing voltage.

3. The nonvolatile semiconductor memory according to claim 2 further comprising a second determining part for determining whether the amount of charges accumulated in the charge accumulating part reaches the first charge amount based on a value of a current from the memory cell upon application of the writing voltage having the second voltage to the drain or source region concerned,
wherein the voltage changing part brings the drain or source region concerned into a high-impedance state if the second determining part determines that the amount of charges accumulated in the charge accumulating part reaches the first charge amount.

4. The nonvolatile semiconductor memory according to claim 1, wherein the drain region has a first extension region for efficient injection of charge, the first extension region has a relatively low impurity concentration, the first charge accumulating part is located on the first extension region, the source region has a second extension region for efficient injection of charge, the second extension region has a relatively low impurity concentration, and the second charge accumulating part is located on the second extension region.

5. The nonvolatile semiconductor memory according to claim 4, wherein the first charge accumulating part extends from the first extension region along a side wall of a gate electrode of the MOSFET structure, and the second charge accumulating part extends from the second extension region along an opposite side wall of the gate electrode of the MOSFET structure.

6. The nonvolatile semiconductor memory according to claim 1, wherein each of the first and second charge accumulating parts includes two silicon oxide films, and a silicon nitride film located between the two silicon oxide films.

7. A data writing method of writing data into a nonvolatile semiconductor memory with a plurality of memory cells, each said memory cell having a MOSFET (Metal-Oxide-Semiconductor Field-Effect Transistor) structure with a first charge accumulating part associated with a drain region of the MOSFET structure and a second charge accumulating part associated with a source region of the MOSFET structure, the method comprising:
selecting at least one of said plurality of memory cells and selecting the drain region or the source region of the selected memory cell for data writing;
injecting charges into the charge accumulating part associated with the selected region of the selected memory cell until an amount of the accumulated charges in the charge accumulating part concerned exceeds a second charge amount smaller than a first charge amount, by applying a first writing voltage corresponding to a value of the data-to-be-written to the selected region of the selected memory cell, said first charge amount corresponding to the value of data-to-be-written; and injecting additional charges into the charge accumulating part of the selected memory cell to make a total amount of the injected charges become the first charge amount by applying a second writing voltage lower than the first writing voltage to the selected region of the selected memory cell.

8. The data writing method according to claim 7, wherein said selecting at least one of said plurality of memory cells includes selecting more than one memory cell, the data-to-be-written to said more than one memory cell being different from each other, said injecting charges is carried out simultaneously for said more than one memory cell and said injecting additional charges is carried out simultaneously for said more than one memory cell.

9. The data writing method according to claim 7 further comprising bringing the selected region of the selected memory cell into a high-impedance state when the amount of charges accumulated in the charge accumulating part concerned reaches the first charge amount.

10. The data writing method according to claim 7 further comprising determining whether the amount of charges accumulated in the charge accumulating part concerned is no less than the first charge amount, prior to said injecting charges into the charge accumulating part concerned.

11. The data writing method according to claim 7, wherein said injecting charges into the charge accumulating part is performed by a plurality of injections.

12. The data writing method according to claim 11, wherein an amount of charge injection is increased every time said injecting charges into the charge accumulating part is performed.

13. The data writing method according to claim 7 further comprising determining whether the amount of charges accumulated in the charge accumulating part reaches the first charge amount, after said injecting additional charges into the charge accumulating part.

14. The data writing method according to claim 7, wherein said injecting charges into the charge accumulating part injects more charges than said injecting additional charges.

15. The data writing method according to claim 7, wherein said injecting charges into the charge accumulating part is performed in a shorter period than said injecting additional charges.

16. A nonvolatile semiconductor memory comprising:
a plurality of memory cells, each said memory cell having an MOSFET (Metal-Oxide-Semiconductor Field-Effect Transistor) structure with a first charge accumulating part associated with its drain region and a second charge accumulating part associated with its source region;
a selection part for selecting one of said plurality of memory cells, and for selecting either the drain region or the source region of the selected memory cell for data writing;
a writing voltage applying part for applying a writing voltage corresponding to data-to-be-written to the selected region of the selected memory cell thereby injecting charges into the charge accumulating part associated with the selected region of the selected memory cell; and
a controller for reducing the writing voltage based on an increase in an amount of the charges accumulated in the charge accumulating part concerned, and continuing a writing operation with the reduced writing voltage.

17. The nonvolatile semiconductor memory according to claim 16, wherein the controller includes:
a writing voltage generating part for generating a first voltage or a second voltage, the second voltage being lower than the first voltage, the first or second voltage being used as the writing voltage;
a first determining part for determining whether the amount of charges accumulated in the charge accumulating part exceeds a second charge amount smaller than a first charge amount corresponding the value of the data-to-be-written, the determination being made based on a value of a current from the selected memory cell; and
a voltage changing part for setting the writing voltage at the first voltage until the first determining part determines that the amount of charges accumulated in the charge accumulating part exceeds the second charge amount, and for changing the writing voltage from the first voltage to the second voltage when the first determining part determines that the amount of charges accumulated in the charge accumulating part exceeds the second charge amount,
wherein the second voltage is the reduced writing voltage.

18. The nonvolatile semiconductor memory according to claim 17 further comprising a second determining part for determining whether the amount of charges accumulated in the charge accumulating part reaches the first charge amount based on a value of a current from the selected memory cell upon application of the writing voltage having the second voltage to the selected region of the selected memory cell,
wherein the voltage changing part brings the selected region of the selected memory cell into a high-impedance state if the second determining part determines that the amount of charges accumulated in the charge accumulating part reaches the first charge amount.

19. The nonvolatile semiconductor memory according to claim 16, wherein the drain region has a first extension region for efficient injection of charge, the first extension region has a relatively low impurity concentration, the first charge accumulating part is located on the first extension region, the source region has a second extension region for efficient injection of charge, the second extension region has a relatively low impurity concentration, and the second charge accumulating part is located on the second extension region.

20. The nonvolatile semiconductor memory according to claim 16, wherein each of the first and second charge accumulating parts includes two silicon oxide films and a silicon nitride film that is located between the two silicon oxide films.

* * * * *